United States Patent
Godwin et al.

(10) Patent No.: US 10,314,189 B2
(45) Date of Patent: Jun. 4, 2019

(54) ELECTRONICS MODULE ENCLOSURE

(71) Applicant: Continental Automotive Systems, Inc., Auburn Hills, MI (US)

(72) Inventors: James G. Godwin, Rochester, MI (US); Kevin Douglas Moore, Hoffman Estates, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 1041 days.

(21) Appl. No.: 14/097,622

(22) Filed: Dec. 5, 2013

(65) Prior Publication Data
US 2014/0170952 A1 Jun. 19, 2014

Related U.S. Application Data

(60) Provisional application No. 61/737,853, filed on Dec. 17, 2012.

(51) Int. Cl.
*H05K 5/02* (2006.01)
*H05K 5/06* (2006.01)

(52) U.S. Cl.
CPC .............. *H05K 5/066* (2013.01); *H05K 5/069* (2013.01); *Y10T 29/49826* (2015.01)

(58) Field of Classification Search
CPC ....... H05K 5/0056; H05K 5/0213; H05K 5/06
USPC ....... 174/50, 17 R, 17 VA, 17 CT, 520, 50.5, 174/547; 411/107, 190, 204; 403/34; 220/200–380
See application file for complete search history.

(56) References Cited

U.S. PATENT DOCUMENTS

| | | | | |
|---|---|---|---|---|
| 2,367,883 A | * | 1/1945 | Miller | B65D 39/06 215/270 |
| 2,889,069 A | * | 6/1959 | Von Fuchs | B01J 3/04 220/288 |
| 3,159,090 A | * | 12/1964 | Schutt | E04B 9/04 181/293 |
| 3,447,564 A | * | 6/1969 | North | F16K 15/044 137/512 |
| 4,340,084 A | * | 7/1982 | Snow | F16K 15/042 137/512 |
| 4,514,125 A | * | 4/1985 | Stol | F16B 13/143 156/294 |
| 5,170,606 A | * | 12/1992 | Popp | F16B 13/141 411/452 |
| 6,896,462 B2 | * | 5/2005 | Stevenson | F16B 13/002 411/1 |
| 2002/0110721 A1 | * | 8/2002 | Hatano | H01M 8/1004 429/434 |
| 2010/0320694 A1 | * | 12/2010 | Gromotka | B29C 45/14385 277/316 |
| 2011/0016836 A1 | * | 1/2011 | Yano | B60R 16/0239 55/491 |
| 2012/0248110 A1 | * | 10/2012 | Wu | B65D 43/0208 220/203.21 |

* cited by examiner

*Primary Examiner* — Steven B McAllister
*Assistant Examiner* — Ko-Wei Lin

(57) ABSTRACT

An electronics housing includes a first enclosure portion defining an internal cavity, a second enclosure portion sealing the internal cavity, at least one vent positioned in one of the first enclosure portion and the second enclosure portion, the vent comprising a through hole protruding from an exterior edge of the vent to an interior edge of the vent, a malleable sealing member disposed in the vent, and a rigid retaining member disposed in the vent.

16 Claims, 1 Drawing Sheet

ELECTRONICS MODULE ENCLOSURE

CROSS-REFERENCE TO RELATED APPLICATIONS

This disclosure claims priority to U.S. Provisional Application No. 61/737,853, which was filed on Dec. 17, 2012 and is incorporated herein by reference.

TECHNICAL FIELD

The present disclosure relates generally to electronics enclosures, and more specifically to a vent seal for an electronics enclosure.

BACKGROUND

Modern vehicles, such as cars, incorporate electronic systems and controllers into the engine designs. The electronic systems enable proper operation of the engine and other vehicle systems during all operating conditions. Some operating conditions, such as rain or sleet, are hazardous to exposed electronics and can damage or destroy exposed electronics. In order to protect the electronic systems, typical vehicles isolate the electronic components from the environmental hazards by placing the electronics within an electronics housing module.

Electronics housing modules include a housing body and a cover that seals the housing body. The sealed enclosure protects the electronics that are contained within from external contaminants. The housing body can further include sealed communication ports allowing the electronics module to be connected to sensors or other electric systems within the vehicle. Once the electronic components are situated within the housing module, the cover is placed on the module, thereby sealing the housing module.

The process of sealing the housing module can displace gasses, such as air, that are located within the housing module. In order to prevent the displaced gasses from damaging the seal while the seal is being applied or is curing, at least one vent is positioned on the housing module and allows gas to escape from the housing module during the sealing process. In order to ensure that the housing module is fully sealed, the vent is then sealed using a vent seal.

SUMMARY OF THE INVENTION

Disclosed is an electronics housing that includes a first enclosure portion defining an internal cavity, a second enclosure portion sealing the internal cavity, at least one vent positioned in one of the first enclosure portion and the second enclosure portion, the vent comprising a through hole protruding from an exterior edge of the vent to an interior edge of the vent, a malleable sealing member disposed in the vent, and a rigid retaining member disposed in the vent.

These and other features of the present invention can be best understood from the following specification and drawings, the following of which is a brief description.

DETAILED DESCRIPTION OF AN EMBODIMENT

Figure 1:
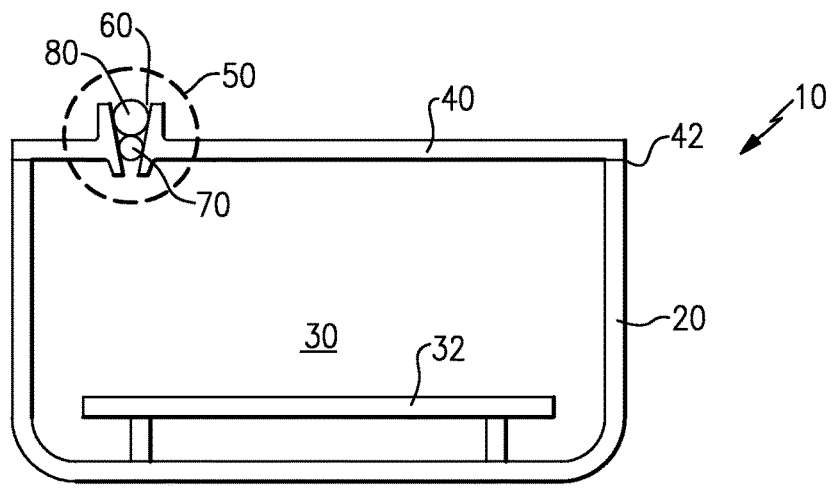
FIG. 1 schematically illustrates an electronics enclosure.

FIG. 1 schematically illustrates an electronics housing module 10. The electronics housing module 10 includes a first housing portion 20 that defines an internal cavity 30. Positioned within the internal cavity 30 is an engine controller 32. In alternate example electronics modules, other electronic components can be included in addition to, or in place of, the engine controller 32. The internal cavity 30 is covered by a module cover 40. The module cover 40 is attached to the first housing portion 20 via a weld, a liquid sealant, or any other suitable seal type at a joint 42.

The process of positioning the module cover 40 and sealing the module cover 40 to the first housing portion 20 displaces air, or any other gas, disposed within the internal cavity 30. In order to allow displaced gasses to escape from the internal cavity 30 without disrupting or damaging the seal at the joint 42, a vent 50 is provided in the module cover 40. In alternate examples, multiple vents 50 can be utilized to the same effect. In yet further alternate examples, vents 50 can be located on the first housing portion 20 in addition to, or in place of, the vents 50 positioned on the module cover 40.

The vent 50 is a through hole 60 that is empty during assembly of the electronics module 10. During assembly, the displaced gasses escape through the through hole 60. Once the cover 40 has been positioned and sealed to the housing portion 20, one or more sealing elements are positioned within the through hole 60. The sealing elements seal the through hole 60, thereby preventing environmental contaminants from entering the internal cavity 30 through the vent 50. In the illustrated example of FIG. 1, the sealing elements are an elastic spheroid 70 and a rigid spheroid 80. The term spheroid is used herein to describe any spherical or approximately spherical shape.

The elastic spheroid is malleable (i.e. can be temporarily deformed) and engages an interior surface of the through hole 60 across a full 360 degree circumference of the through hole 60. The contact between the elastic spheroid 70 and the interior surface of the through hole 60 seals the vent 50 and prevents external contaminants from entering the internal cavity 30. The rigid spheroid 80 is positioned in the through hole 60 exterior to the elastic spheroid 70 and is maintained in position via an interference fit between the rigid spheroid 80 and the interior surface of the through hole 60. The presence of the rigid spheroid 80 protects the elastic spheroid 70 from damage from environmental conditions and maintains the elastic spheroid 70 in position.

While FIG. 1 illustrates a vent sealed via an elastic spheroid 70 and a rigid spheroid 80, it is further understood that alternate shaped sealing elements can be used to seal the vent.

Figure 2:
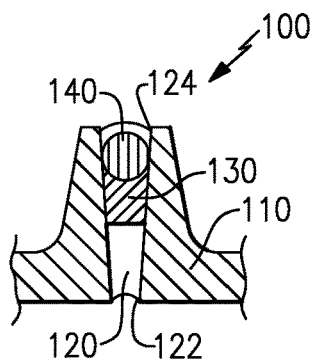
FIG. 2 schematically illustrates a first example vent seal.

With continued reference to FIG. 1, and with like numerals indicating like elements, FIG. 2 illustrates a first example sealing configuration for use in an electronics module vent 100. The vent 100 includes a through hole 120 with an interior facing surface that is tapered. The through hole 120 defines internal edge radius 122 that is smaller than an external radius 124. The seal illustrated in FIG. 2 includes a liquid sealant 130 disposed within the through hole 120. The liquid sealant 130 serves the same function as the elastic spheroid 70 of FIG. 1. The liquid sealant 130 can be any liquid sealant that is sufficiently viscous to be retained in position within the through hole 120 while in its liquid state (before curing.) The liquid sealant 130 contacts the interior surface of the through hole 120 in a full 360 degree circumference, and maintains the contact during and after curing. As a result of the contact, the cured liquid sealant 130 maintains a seal within the vent 100 and prevents environmental contaminants from entering the internal cavity 30 (illustrated in FIG. 1).

A rigid spheroid 140, such as a steel ball bearing, is placed in the through hole 120 exterior to the liquid sealant 130 while the liquid sealant 130 is curing. In alternate examples, the rigid spheroid 140 can be positioned in the vent after the liquid sealant 130 has fully cured. The rigid spheroid 140 is maintained in position via an interference fit with the interior surface of the through hole 120. The rigid spheroid 140 provides a physical barrier that prevents debris and other external contaminants from impacting the liquid sealant 130 after it has cured. The rigid spheroid 140 further maintains the liquid sealant 130 in position in the case that the liquid sealant 130 loosens as the result of vibrations or impacts. In this way the rigid spheroid 140 protects the vent seal and increases the longevity of the electronics module 10. While referred to as a liquid sealant 130 herein, one of skill in the art having the benefit of this disclosure will understand that the liquid sealant 130 is only a liquid pre-curing.

Figure 3:
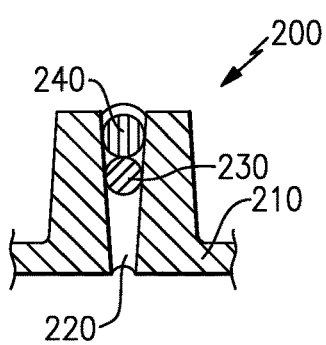
FIG. 3 schematically illustrates a second example vent seal.

With continued reference to FIG. 1, and with like numerals indicating like elements, FIG. 3 illustrates an alternate vent 200 including a through hole 220 in the housing 210 of an electronics module. As with the examples of FIG. 2, the through hole 220 has an interior facing surface that is tapered with an internal edge radius that is smaller than an external edge radius. Once the module has been assembled, and the seal on the module housing 210 has been established, the vent 200 is sealed via the utilization of an elastic spheroid 230, such as an elastic ball, that is positioned in the through hole 220. The elastic spheroid 230 is malleable and is pushed into the through hole 220 from the exterior opening until the elastic spheroid 230 has deformed such that the elastic spheroid 230 presses against the interior surface of the through hole 220 in a full 360 degree arc. The contact between the elastic spheroid 230 and the interior surface of the through hole 220 prevents contaminants from passing into the internal cavity 30 (illustrated in FIG. 1).

Once the elastic spheroid 230 is in position, a rigid spheroid 240, such as a steel ball bearing, is positioned in the through hole 220 exterior to the elastic spheroid 230. The rigid spheroid 240 is maintained in the through hole 220 via an interference fit with the interior surface of the through hole 220. The rigid spheroid 240, in turn, maintains the elastic spheroid 230 in position in the through hole 220. As with the example of FIG. 2, the rigid spheroid 240 protects the malleable elastic spheroid 230 from damage from external contaminants, the rigid spheroid 240 further prevents the elastic ball from being dislodged or coming loose during operation of the vehicle engine.

Figure 4:
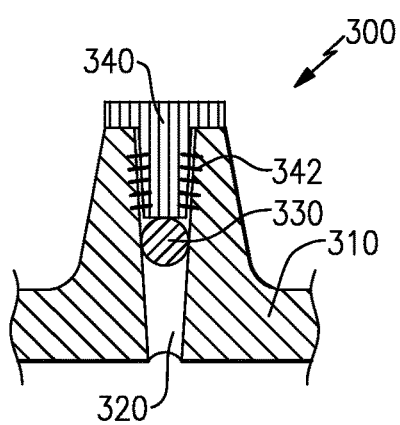
FIG. 4 schematically illustrates a third example vent seal.

With continued reference to FIG. 1, and with like numerals indicating like elements, FIG. 4 illustrates a third alternate example vent 300. As with the examples of FIGS. 2 and 3, the example vent 300 of FIG. 4 includes a through hole 320 having a tapered interior surface, with a radius of the interior surface of the through hole 320 at an interior edge of the through hole being smaller than a radius of the through hole at an external edge of the through hole 320.

Received within the through hole 320 is a malleable spheroid 330, such as an elastic ball. As with the previous example vents 100, 200, the malleable spheroid 330 is pushed into the through hole 320 until it deforms and creates a contact seal on a full 360 degree circumference of the through hole 320. A plug 340, or insert, is then inserted into the through hole 320, and maintains the malleable spheroid 330 in position. The plug 340 is rigid material. In the illustrated example of FIG. 4, the plug 340 is maintained in position via threading 342. In alternate examples the plug 340 can be maintained in position via any other standard means.

While some of the above described examples utilize malleable spheroids and rigid spheroids, it is understood that alternate shaped sealing elements, such as cylinders or plug shaped elements could be utilized to similar effect and still fall within the above described disclosure.

Furthermore, while the above examples are described individually, it will be understood by one of skill in the art having the benefit of this disclosure that an electronics module utilizing multiple vents can intermix different vent types in any combination, and the electronics module 10 of FIG. 1 is not limited to a single example vent type.

Even further still, while each of the above describes vents 50, 100, 200, 300 includes a tapered interior surface, alternate vents utilizing a non-tapered through hole can also be implemented and full within the above disclosure.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electronics housing comprising:
a first enclosure portion defining an internal cavity;
a second enclosure portion at least partially covering said internal cavity;
at least one vent positioned in one of said first enclosure portion and said second enclosure portion;
said vent comprising a through hole protruding from an exterior edge of the vent to an interior edge of the vent, through hole including a radially interior tapered surface, wherein the radially interior tapered surface extends an entire length of the through hole;
a malleable sealing member disposed in said vent, wherein the malleable sealing member is a malleable spheroid and wherein the malleable sealing member contacts a full circumference of the tapered surface while the vent is closed;
a rigid retaining member disposed in said vent and directly contacting said malleable sealing member, wherein the rigid retaining member is a rigid spheroid and is maintained in position within said vent via an interference fit with the radially interior tapered surface of said vent; and
wherein the internal cavity is sealed by a combination of the second enclosure portion, the at least one vent, and the malleable sealing member.

2. The electronics housing of claim 1, wherein the through hole is a tapered through hole having a first radius at said interior edge and a second radius at said exterior edge, wherein the first radius is smaller than the second radius.

3. The electronics housing of claim 1, wherein the malleable spheroid is an elastic ball.

4. The electronics housing of claim 1, wherein the malleable sealing member is retained in position in said vent via contact with said rigid retaining member.

5. The electronics housing of claim 1, wherein the internal cavity houses an engine controller.

6. The electronics housing of claim 1, wherein the at least one vent is positioned in the second enclosure portion.

7. The electronics housing of claim 1, wherein the at least one vent comprises a plurality of vents.

8. The electronics housing of claim 7, wherein each vent in the plurality of vents is substantially identical.

9. The electronics housing of claim 2, wherein the radius of the tapered through hole continuously increases from the first radius to the second radius.

10. The electronics housing of claim 1, wherein the malleable sealing member is fully disposed in said vent such that no portion of the malleable sealing member is disposed within the internal cavity.

11. The electronics house of claim 1, wherein the second enclosure portion is a distinct component from the first enclosure portion.

12. The electronics housing of claim 11, wherein the second enclosure portion is attached to the first enclosure portion via a seal.

13. The electronics housing of claim 12, wherein the seal is one of a weld and a liquid sealant.

14. The electronics housing of claim 1, wherein the rigid retaining member is disposed in said vent such that no portion of the rigid member is disposed within the internal cavity.

15. The electronics housing of claim 1, wherein the malleable sealing member is maintained in position, relative to the vent, via the rigid sealing member.

16. The electronics housing of claim 1, wherein the malleable sealing member is disposed between the rigid retaining member and the internal cavity.

* * * * *